(12) United States Patent
Kalevo

(10) Patent No.: US 8,810,439 B1
(45) Date of Patent: Aug. 19, 2014

(54) ENCODER, DECODER AND METHOD

(71) Applicant: Gurulogic Microsystems Oy, Turku (FI)

(72) Inventor: Ossi Mikael Kalevo, Toijala (FI)

(73) Assignee: Gurulogic Microsystems Oy, Turku (FI)

( * ) Notice: Subject to any disclaimer, the term of this patent is extended or adjusted under 35 U.S.C. 154(b) by 0 days.

(21) Appl. No.: 13/782,819

(22) Filed: Mar. 1, 2013

(30) Foreign Application Priority Data

Mar. 1, 2013 (GB) .................................. 1303661.1

(51) Int. Cl.
*H03M 7/30* (2006.01)

(52) U.S. Cl.
USPC ............................................. 341/76; 341/50

(58) Field of Classification Search
CPC ...... H03M 7/30; H04N 7/50; H04L 29/08072
USPC .......... 341/76, 50, 51; 375/240; 709/202, 203
See application file for complete search history.

(56) References Cited

U.S. PATENT DOCUMENTS

| | | | |
|---|---|---|---|
| 4,791,483 A | 12/1988 | Miller | |
| 5,864,650 A * | 1/1999 | Taniguchi et al. | ............ 704/220 |
| 6,642,874 B1 | 11/2003 | Lin et al. | |
| 2012/0141040 A1 | 6/2012 | Napper | |

FOREIGN PATENT DOCUMENTS

| | | |
|---|---|---|
| EP | 1 376 974 A1 | 1/2004 |
| EP | 2 214 315 | 8/2010 |

OTHER PUBLICATIONS

Combined Search and Examination Report Under Sections 17 and 18(3) dated Sep. 5, 2013, issued by UKIPO in related U.K. Patent Application No. GB1303661.1 (6 pages).
Notification of Transmittal of the International Search Report and the Written Opinion, PCT International Search Report and Written Opinion mailed Jun. 12, 2014, which was issued by ISA/EP in a related PCT application No. PCT/EP2014/000510 filed Feb. 27, 2014 (8 pages).

* cited by examiner

*Primary Examiner* — Joseph Lauture
(74) *Attorney, Agent, or Firm* — Lucas & Mercanti LLP; Robert P. Michal

(57) ABSTRACT

There is provided an encoder and decoder for encoding and decoding input data (D1, D2 or D3) to generate corresponding encoded output data (D2 or D3, D5). The encoder includes a data processing arrangement, optionally for analyzing a range of values present in the input data (D1) to determine at least one pre- and/or post-pedestal value, optionally to translate the input data (D1) using the at least one pre- and/or post-pedestal value to generate translated data, and then to apply a form of ODelta coding to the data, optionally translated data, to generate processed data, and to combine the processed data and optionally the at least one pre- and/or post-pedestal value for generating the encoded output data (D2 or D3). The decoder includes a data processing arrangement for processing the encoded data (D2 or D3), optionally to extract therefrom at least one pre- and/or post-pedestal value.

36 Claims, 3 Drawing Sheets

ENCODER, DECODER AND METHOD

TECHNICAL FIELD

The present disclosure relates to encoders, for example to encoders which are operable to employ a direct ODelta operator. Moreover, the present disclosure is concerned with methods of encoding data, for example with methods of encoding data by employing a direct ODelta operator. Furthermore, the present disclosure also relates to decoders for decoding encoded data which are subject to an inverse ODelta operator. Additionally, the present disclosure is concerned with methods of decoding encoded data which are subject to an inverse ODelta operator. Yet additionally, the present disclosure relates to software products recorded on machine-readable data storage media, wherein the software products are executable upon computing hardware for implementing aforesaid methods.

BACKGROUND OF THE INVENTION

Claude E. Shannon proposed a mathematical theory of communication which has provided a basis for contemporary communication systems. Moreover, various contemporary encoding methods have been evolved in knowledge of the aforesaid mathematical theory. A list of information sources providing an overview of contemporary technical knowledge is provided in Table 1.

TABLE 1

| Known technical art | |
|---|---|
| Earlier document | Detail |
| P1 | "Variable-length code", Wikipedia (accessed 28 Nov. 2012) URL: http://en.wikipedia.org/wiki/Variable-length_code |
| P2 | "Run-length encoding", Wikipedia (accessed 28 Nov. 2012) URL: http://en.wikipedia.org/wiki/Run-length_encoding |
| P3 | "Huffman coding", Wikipedia (accessed 28 Nov. 2012) URL: http://en.wikipedia.org/wiki/Huffman_coding |
| P4 | "Arithmetic coding", Wikipedia (accessed 28 Nov. 2012) URL: http://en.wikipedia.org/wiki/Arithmetic_coding |
| P5 | "A Mathematic Theory of Communication", Shannon, Claude E. (1948) (accessed 28 Nov. 2012) URL: http://cm:bell-labs.com/cm/ms/what/shaddonday/shaddon1948.pdf |
| P6 | "Delta encoding", Wikipedia (accessed 28 Nov. 2012) URL: http://en.wikipedia.org/wiki/Delta_coding |
| P7 | Shannon's source coding theorem; Wikipedia (accessed 28 Nov. 2012) URL: http://en.wikipedia.org/wiki/Source_coding_theorem |
| P8 | "Entropy" - Wikipedia (accessed 28 Nov. 2012) URL: http://en.wikipedia/wiki/Entropy |

The definition of Shannon entropy is provided in documents P7 and P8 listed in Table 1. There is a multitude of different compression methods that are operable to compress entropy present in given data, and such methods are sometimes employed to modify entropy, for example for obtaining greater lossless compression ratios for the given data; such entropy-modifying methods include, for example, run-length-encoding (RLE) as described in document P2 in Table 1, variable-length-coding (VLC) as described in document P1 in Table 1, Huffman coding as described in document P3 in Table 1, Delta coding as described in document P6 in Table 1, and Arithmetic coding, namely Range coding, as described in document P4 in Table 1. Such methods are beneficially employed to compress data representative of alphabetic characters, numbers, bytes and words. However, such methods are not well adapted to compress given data at a bit-level, and for that reason are not well suited for compressing such given data that is susceptible to changing bit-by-bit.

Delta encoding, for example as described in document P6 in Table 1, is operable to generate delta values that can be positive or negative values from the positive original data values. Moreover, there are known implementations of Delta encoders for use in 8-bit, 16-bit or 32-bit wraparound, based upon used sizes of data elements. However, there is a lack of contemporary Delta encoders that are optimized for regimes other than 8-bit, 16-bit or 32-bit values. In particular, known Delta encoders are especially inefficient when coding original bit values, namely "0" and "1", as three different values typically result therefrom, namely "−1", "0" and "1".

All kinds of data consume storage space, and communication system transmission capacity is needed when such data is to be moved from one location to another. As quantities of data increase, for example as a result of multimedia developments such as 3-dimensional video content, correspondingly more storage space and transmission capacity are needed to handle the data, and also more energy is needed as the quantity of data increases. Globally, quantities of data being communicated are progressively increasing with time; for example, the Internet contains a huge amount of data, some of which is stored in multiple copies. Moreover, there are methods which are contemporarily available for compressing entropy E associated with data, for example for use when reducing size of the data. Furthermore, there are also available methods of modifying entropy, for example Delta encoding and run-length encoding (RLE), but improved methods are required for providing even greater data compression than is contemporarily feasible.

There is also a need to optimize utilization of known Delta encoding methods for enabling faster and more efficient encoding of original data to be achieved, for example when all values in data elements in the original data are not used and/or a preceding or following encoding method employed in combination with Delta encoding methods requires a higher bit format than a bit dynamic originally used for data to be encoded.

SUMMARY OF THE INVENTION

The present invention seeks to provide an improved form of Delta encoder, namely a direct ODelta encoder, which is more efficient when encoding individual bits as well as other values of data.

Moreover, the present invention seeks to provide an improved method of Delta encoding data, namely a method of direct ODelta encoding the data.

Furthermore, the present invention seeks to provide an improved decoder for decoding ODelta-encoded data, namely an inverse ODelta decoder.

Additionally, the present invention seeks to provide an improved method of decoding ODelta-encoded data, namely a method of inverse ODelta decoding of the data.

According to a first aspect of the present invention, there is provided an encoder as claimed in appended claim 1: there is provided an encoder for encoding input data (D1) to generate corresponding encoded output data (D2), wherein the encoder includes a data processing arrangement for analyzing values present in the input data (D1), and for translating the input data (D1) using results of the analysis to generate translated data by applying a form of ODelta coding within at least one parameter to the data to generate processed data, and to combine the processed data with the results of the analysis for generating the encoded output data (D2).

The invention is of advantage in that a combination of use of the analysis and the form of ODelta coding is capable of providing useful entropy modification of the input data (D1) to D2 which enables enhanced data compression to be achieved within some entropy encoder when generating the encoded data (D3) from the encoded data (D2).

Optionally, in the encoder, the data processing arrangement is operable to analyze a range of values in the input data (D1) and to generate at least one pre- and/or post-pedestal value. The pre-pedestal value can be used to generate the translated data before use of the direct ODelta operator, and the post-pedestal value can be used to generate the translated data after the direct ODelta operator. The at least one pedestal value is combined with the processed data for generating the encoded output data (D2 or D3).

Optionally, the encoder is operable to subdivide the input data (D1) into a plurality of sections of data which are separately encoded. More optionally, the encoder is operable to apply the form of ODelta coding selectively to the sections of data only when data compression is thereby achievable in the encoded output data (D2 or D3).

Optionally, the encoder is operable to apply a form of 1-bit ODelta coding to the translated data. More optionally, the encoder is operable to employ a default first value for a series of encoded values present in the output encoded data (D2 or D3). Yet more optionally, the encoder is implemented so that the default first value is "0" for 1-bit data and a mid-range value for other data.

Optionally, the encoder is operable to apply additional encoding to the processed data to generate the encoded output data (D3), wherein the additional encoding includes at least one of: run-length encoding (RLE), variable length coding (VLC), Huffman coding, arithmetic coding, range coding.

Optionally, the encoder is implemented such that the form of direct ODelta coding employs a wraparound within a parameter (maxValue) and range of data (lowValue or highValue).

Optionally, the encoder is operable to subdivide the input data (D1) into a plurality of sections depending upon run-lengths of mutually similar bits in the processed data which are efficient for encoding using run-length encoding (RLE), Huffman coding, variable-length encoding (VLE), arithmetic encoding and/or range encoding.

Optionally, the encoder is implemented such that the processing arrangement is implementing using computing hardware operable to execute one or more software products recorded on machine-readable data-storage media.

According to a second aspect of the invention, there is provided a method of using an encoder for encoding input data (D1) to generate corresponding encoded output data (D2), wherein the method includes:
(a) using a data processing arrangement for analyzing values present in the input data (D1);
(b) using the data processing arrangement to apply a form of direct ODelta coding to the data to generate processed data; and
(c) using the data processing arrangement to combine the processed data and results of the analysis for generating the encoded output data (D2 or D3).

Optionally, the method includes in step (c) using the data processing arrangement to translate the input data (D1) based upon results of the analysis to generate translated data, wherein such translation can be applied as post-translation and/or pre-translation.

Optionally, the method includes using the data processing arrangement to analyze a range of values in the input data (D1) and to generate at least one pre- or post-pedestal value for use in generating the translated data, and to combine the processed data and the at least one pre- or post-pedestal value for generating the encoded output data (D2 or D3).

Optionally, the method includes using the data processing arrangement to subdivide the input data (D1) into a plurality of sections of data which are then separately encoded. More optionally, the method includes applying the form of direct ODelta coding selectively to the sections of data only when data compression is thereby achievable in the encoded output data (D2 or D3).

Optionally, the method includes applying a form of 1-bit Delta coding to the translated data. More optionally, the method includes employing a default first value for a series of encoded values present in the output encoded data (D2 or D3). Yet more optionally, the method includes employing a value "0" for the default first value for 1-bit data and a mid-range value for other data.

Optionally, the method includes applying additional encoding to the processed data to generate the encoded output data (D3), wherein the additional encoding includes at least one of: run-length encoding (RLE), variable length coding (VLC), Huffman coding, arithmetic coding, range coding.

Optionally, in the method, the form of Delta coding employs a wraparound within a parameter (maxValue) and range of data (lowValue or highValue).

Optionally, the method includes implementing the processing arrangement using computing hardware operable to execute one or more software products recorded on machine-readable data-storage media.

According to a third aspect of the invention, there is provided a decoder for decoding encoded data (D3 or D4) to generate corresponding decoded output data (D5), wherein the decoder includes a data processing arrangement for processing the encoded data (D3 or D4) for applying a form of inverse ODelta decoding to one or more portions of the encoded data (D3 or D4) to generate the decoded output data (D5).

Optionally, in the decoder, the data processing arrangement is operable to analyze a range of values in the encoded data (D3 or D4) and to derive therefrom at least one pre- and/or post-pedestal value. The post-pedestal value can be used to generate the translated data before use of the inverse direct ODelta operator, and the pre-pedestal value can be used to translate data after the direct inverse ODelta operator. The at least one pedestal value is combined with the processed data for generating the decoded output data (D5).

The pedestal is optional for the decoder. The wraparound within a parameter (maxValue) that uses the range (lowValue or highValue), the inverse operator (sum vs. difference) and the inverse predictor (input value vs. output value) are important elements of the decoder.

Optionally, in the decoder, the data processing arrangement is operable to apply to data being processed therethrough an inverse of at least one of: run-length encoding (RLE), variable-length coding (VLC), Huffman coding, arithmetic coding, range coding. This processing is executed for the purpose of generating data (D4) from data (D3).

In the decoder, the data processing arrangement is operable to employ a wraparound within a parameter (maxValue) using range (lowValue or highValue) when implemented in the form of inverse ODelta decoding.

Optionally, in the decoder, the data processing arrangement is operable to assume a default value of first value in a series of data being decoded therethrough. More optionally, in the decoder, the default value has a value "0" for 1-bit data and a mid-range value for other data.

Optionally, in the decoder, the processing arrangement is implemented using computing hardware operable to execute one or more software products recorded on machine-readable data-storage media.

According to a fourth aspect of the invention, there is provided a method of using a decoder for decoding encoded data (D3 or D4) to generate corresponding decoded output data (D5), wherein the method includes:
(a) using a data processing arrangement to apply a form of inverse ODelta decoding to one or more portions of the encoded data (D3 or D4) to generate corresponding processed data; and
(b) using the data processing arrangement to translate the one or more portions of data to the decoded output data (D5).

Optionally, the method includes using the data processing arrangement to process the encoded data (D3 or D4) to extract therefrom at least one pre- and/or post-pedestal value.

The wraparound within a parameter (maxValue) using range (lowValue or highValue), the inverse operator (sum vs. difference) and the inverse predictor (input value vs. output value) are important elements of the decoder.

Optionally, the method includes using the data processing arrangement to apply to data being processed therethrough an inverse of at least one of: run-length encoding (RLE), variable-length coding (VLC), Huffman coding, arithmetic coding, range coding. This processing is executed for the purpose of generating data (D4) from data (D3).

Optionally, the method includes using the data processing arrangement to employ a wraparound for a parameter (maxValue) using range (lowValue or highValue) when implemented the form of inverse ODelta decoding.

Optionally, the method includes using the data processing arrangement to assume a default value of first value in a series of data being decoded therethrough. More optionally, in the method, the default value has a value "0" for 1-bit data and a mid-range value for other data.

Optionally, the method includes implementing the processing arrangement using computing hardware operable to execute one or more software products recorded on machine-readable data-storage media.

According to a fifth aspect of the invention, there is provided a codec including at least one encoder pursuant to the first aspect of the invention for encoding input data (D1) to generate corresponding encoded data (D2 or D3), and at least one decoder pursuant to the third aspect of the invention for decoding the encoded (D3 or D4) to generate corresponding decoded data (D5).

According to a sixth aspect of the invention, there is provided a software product recorded on machine-readable data storage media, wherein the software product is executable upon computing hardware for executing a method of encoding data pursuant to the second aspect of the invention.

According to a seventh aspect of the invention, there is provided a software product recorded on machine-readable data storage media, wherein the software product is executable upon computing hardware for executing a method of decoding data pursuant to the fourth aspect of the invention.

It will be appreciated that features of the invention are susceptible to being combined in various combinations without departing from the scope of the invention as defined by the appended claims.

DESCRIPTION OF THE DIAGRAMS

Embodiments of the present invention will now be described, by way of example only, with reference to the following diagrams wherein.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS OF THE INVENTION

When describing embodiments of the present invention, following acronyms and definitions will be used, as provided in Table 2:

TABLE 2

Acronyms and definitions

| Acronym | Description |
| --- | --- |
| ADC | Analog-to-digital converter |
| Codec | Encode and corresponding decoder for digital data |
| DAC | Digital-to-analog converter |
| DB | Database in Random Access Memory (RAM) or Read Only Memory (ROM) |
| DC | DC-component of a given image, namely a mean of the image, namely corresponding to an average brightness and represents a lowest spatial frequency component of an image |
| RLE | Run-length encoding |
| ROI | Region of interest |
| ROM | Read Only Memory |
| VLC | Variable-length code |

Figure 1:
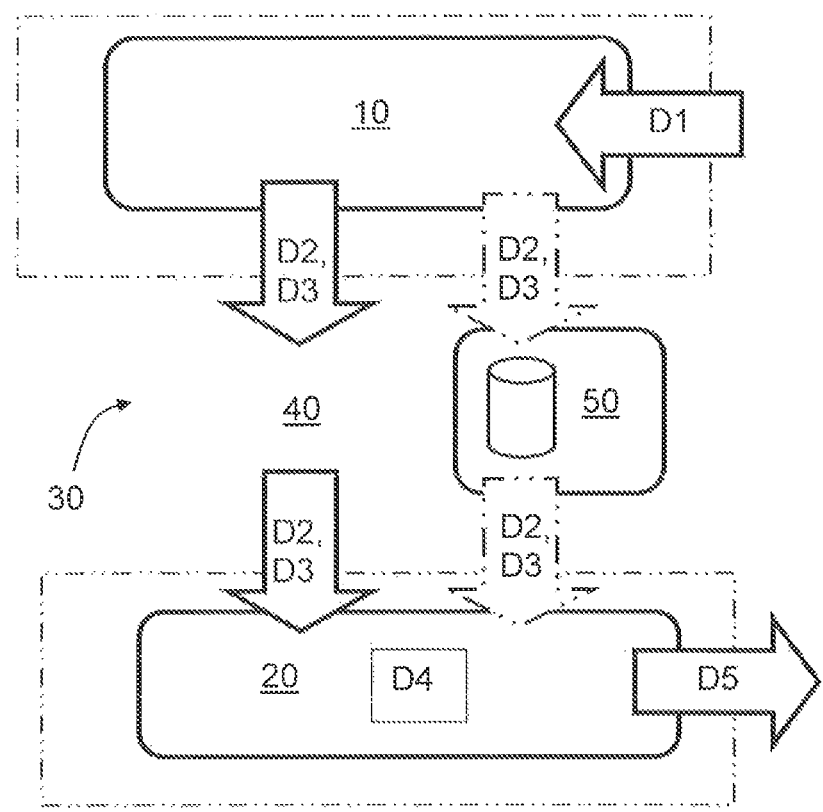
FIG. 1 is an illustration of a codec including an encoder and a decoder implemented to function pursuant to the present invention.

In overview, with reference to FIG. 1, the present invention is concerned with a direct ODelta encoder 10 and its associated method of operation. Moreover, the present invention is also concerned with a corresponding inverse ODelta decoder 20. Embodiments of the invention employ a direct ODelta operator which is a bit-optimized version of the aforementioned known Delta encoding method as well as a range-optimized version for other data. ODelta encoding is used in computing hardware that employs variable-length data words, for example 8/16/32/64 bits, and/or employs variable-length encoding of 8/16/32/64 bit data elements whose original value is expressed in a range of 1 to 64 bits, and a corresponding encoded value is generated with 1 to 64 bits. Of course, the encoder 10 and the decoder 20 are, in any case, aware of which sort of number values the original data D1 may contain, and therefore its definition or transmission will not be further elucidated here. It is merely assumed that the number range (MIN and MAX) is known, and that the data D1 can be utilized.

Known Delta coding methods increase the range of values from original (MIN . . . MAX) to a result (MIN-MAX . . . MAX-MIN). This means that it is also creating negative values when the original data contains only positive values. The ODelta operator pursuant to the present invention never creates a value that is not in the range of corresponding original values, and so it does not increase a used data range, and thus is beneficially employed when executing entropy reduction and associated data compression. For example, known Delta encoding methods operate with streams of 5-bit data, namely values from 0 to 31, such that generated data values will be in a range −31 to +31, namely 63 values which is substantially expressible using 6 bits; in contradistinction, the direct ODelta generated values are still in a range of 0 to 31 when generated from aforesaid streams of 5-bit data. Moreover, whereas known methods of Delta encoding are not possible to be implemented recursively, the direct, or inverse, ODelta operator pursuant to the present invention is susceptible to being implemented recursively and yet it still preserves the used range of values. The range of value does not need to be bit-exact, for example values of 0 to 31 are defined by 5 bits; the ODelta operator is able to use any range of values, for example a range of values from 0 to 25, whilst still operating properly.

In principle, the ODelta methods herewith described can always function directly on a basis of an existing data range, of which will be given an example below. The ODelta operation can also be enhanced by delivering information indicative of a lowest occurring number value in the data (lowValue) and a highest occurring number value in the data (highValue). It is to be noted that lowValue>=MIN, and highValue<=MAX and that these values are optional.

Two examples of direct and inverse ODelta operators pursuant to the present invention will be described below. A first example of the direct and inverse ODelta operator is efficient and relative simple to implement, for example in electronic hardware and/or computing hardware operable to execute one or more software products recorded on machine-readable data storage media.

When implementing direct or inverse ODelta operators pursuant to the present invention, beneficially all the original sequence of data values are positive and the lowest value is 0. Optionally, some offset value, namely pre- or post-pedestal value, can be employed to shift the data values so that they are all positive in value and the lowest value is "0". The ODelta operator pursuant to the present invention is susceptible to being employed with all types of data in a direct manner; it is typically capable of providing data compression, namely reducing communicated data rate, because when the pedestal value is added to all values or subtracted from all values, the range of data values might be defined using fewer bits. For example, original data values, prior to an application of the direct or inverse ODelta operator, are in a range from −11 to +18; such a range can be translated to a range of 0 to 29 by using a pedestal value of 11 and the translated range thereafter described by 5-bits. When such a pre- or post-pedestal value is not employed, the original data values require at least 6 bits to describe them, and often, in practice, a full 8-bit signed byte is employed for convenience.

A similar optimization of data range is also possible when using a generalized direct or inverse ODelta operator. Thus, if the direct or inverse ODelta operator, or some other method, creates the data values that can be presented with a pedestal value smaller than the full range of values, then that range optimization can be implemented in any phase in the ODelta encoding method. When the pedestal value, whether negative or positive in sign, is used, it has also to be delivered from the encoder 10 to the decoder 20 as elucidated later with reference to FIG. 1, FIG. 2 and FIG. 3.

The direct version of the 1-bit ODelta operator, namely method 1 and method 3, creates a value "0" when there is no change in bit values in original data D1 in FIG. 1, and a value "1" when a change in bit values on the original data D1 occurs. The prediction for the first bit in the original data is a value "0", and so the value of the first bit in the original data D1 is preserved. It is also possible to employ a predicted value first bit in the original data as a value "1", but such a choice does not provide any coding benefits: for this reason, no selection needs to be delivered when the prediction is optionally always assumed to be a value "0" by default for 1-bit data.

An example of direct ODelta encoding pursuant to the present invention will now be provided. An original sequence of bits, namely twenty seven bits, including seventeen "1's" and twenty "0's", is provided in Equation 1 (Eq. 1) as follows:

$$010101100100010100000000000001111111111 \qquad \text{Eq. 1}$$

whose entropy E is calculable from Equation 2 (Eq. 2):

$$E = 17 * \log_{10}\left(\frac{37}{17}\right) + 20 * \left(\frac{37}{20}\right) = 11.08523 \qquad \text{Eq. 2}$$

A number of bits, namely Min_bit, required to code the entropy E in Equation 2 (Eq. 2) is calculable from Shannon's source coding theorem, as described in aforesaid documents D7 and D8, as provided in Equation 3 (Eq. 3):

$$\text{Min\_bits} = \frac{E}{\log_{10}(2)} = 36.82 \text{ bits} \qquad \text{Eq. 3}$$

When the original sequence of bits is subject to a direct ODelta operator, namely method 1 and method 3, there is generated a sequence of bits as follows, including thirty seven bits of which there are thirteen "1's" and twenty four "0's":

$$0111110101100111100000000001000000000 \qquad \text{Eq. 4}$$

whose entropy E is calculable from Equation 5 (Eq. 5):

$$E = 13 * \log_{10}\left(\frac{37}{13}\right) + 20 * \left(\frac{37}{24}\right) = 10.41713 \qquad \text{Eq. 5}$$

which is expressible in a minimum number of bits, namely Min_bits, according to Equation 6 (Eq. 6):

$$\text{Min\_bits} = \frac{E}{\log_{10}(2)} = 34.60 \text{ bits} \qquad \text{Eq. 6}$$

The sequence of bits in Equation 4 (Eq. 4) is beneficially subject to further encoding to achieve data compression, for example run-length encoding (RLE), Huffman coding, arithmetic encoding, range encoding, Entropy Modifier encoding or SRLE encoding.

The ODelta operator reduces the amount of bits required when its associated entropy coding method is applied, for example RLE or SRLE is used for the operated data, for example as in Equation 4 (Eq. 4), instead of the original data, for example as in Equation 1 (Eq. 1); this 1-bit direct ODelta operator, namely method 1 and method 3, creates "1's" when there are a lot of changes in the original sequence of bits in Equation 1 (Eq. 1), and it generates "0's" when there is a long stream of mutually similar bits in the original sequence of bits in Equation 1 (Eq. 1).

The inverse version of the ODelta operator, namely method 1 and method 3, changes a bit value from a value "0" to a value "1", or from a value "1" to a value "0" as appropriate, when there is a value "1" in the encoded stream of data, namely data D2, and does not change the bit value when there is a "0" value in the encoded stream of data D2. When this ODelta operation is executed for the direct ODelta-operated bit stream of data D2, the original stream of data D1 is regenerated as the decoded data D5; however, as aforementioned, additional coding such as VLC or Huffman coding is beneficially employed which also needs to be taken into account; this means that data D3 is generated from data D2 using a forward operation of entropy encoder and data D4 is generated from data D3 using an inverse operation of entropy decoder.

Beneficially, the original stream of data D1 is subdivided into two or more sections prior to encoding being applied thereto. Such subdivisions provide an opportunity for more optimization to be employed when encoding the original stream of data D1. For example, such subdivision is beneficial because changeable sequences in the data D1 generate more "1's" when direct ODelta encoded, namely method 1 and method 3, whereas flat unchangeable sequences, namely "flat" sequences, create more "0's", for example desirable for subsequent VRL encoding or Huffman encoding, so entropy E can be reduced for the entire bit stream constituting the data D1 by dividing it into a plurality of sections which can be separately encoded as aforementioned.

An example of direct ODelta encoding pursuant to the present invention will next be described when a plurality of sections are employed which are mutually separately encoded. A first section including a sequence of original single bits includes sixteen bits in total, namely seven "1's" and nine "0's", as follows in Equation 7 (Eq. 7):

$$0101011001000101 \qquad \text{Eq. 7}$$

wherein $H(X)=4.7621$ and $B=15.82$; "H" denotes entropy and "B" denotes Max_bit. When Equation 7 (Eq. 7) sequence of original bits is subject to a direct ODelta operator, a sequence of corresponding transformed bits is provided as in Equation 8 (Eq. 8):

$$0111110101100111 \qquad \text{Eq. 8}$$

wherein $H(X)=4.3158$ and $B=14.34$.

A second section including a sequence of original single bits includes as follows in Equation 9 (Eq. 9):

$$0000000000011111111111 \qquad \text{Eq. 9}$$

wherein $H(X)=6.3113$ and $B=20.97$. When Equation 9 (Eq. 9) sequence of original bits is subject to a direct ODelta operator, a sequence of corresponding transformed bits is provided as in Equation 10 (Eq. 10):

$$000000000001000000000 \qquad \text{Eq. 10}$$

wherein $H(X)=1.7460$ and $B=5.80$. In these examples, as aforementioned, $H(X)$ is representative of entropy E, and B is representative of a minimum number of bits required for coding.

The best compression in this example from Equation 7 (Eq. 7) and Equation 10 (Eq. 10) is achieved when both sections are separately subjected to a direct ODelta operator (namely encoding to 14.34 bits+5.80 bits=20.14 bits in total); this requires less bits than the 36.82 bits that were originally required, direct ODelta-operated bits requiring 34.60 bits, or the original number of bits required after splitting (=15.82 bits+20.97 bits=36.79 bits). Beneficially, splitting of an original stream of bits in the data D1 into sections is executed automatically by analyzing entropy E of the original data D1 and the corresponding entropy H of the modified data, namely as included in the data D2, piece-by-piece.

Data compression is optionally implemented in a coarse manner merely by dividing portions of the data D1 to a new section to be encoded, when there are multiple long run sections available in the data D1, provided that there is a big enough area of data wherein bit values change rapidly along the sequence. Optionally, some sections of the data D1 are encoded without employing the direct ODelta operator, for example if there is a long run of mutually similar bits with relatively few individual different bits therebetween; in such case, the direct ODelta operator does not impart significant benefit for data compression purposes.

Splitting the data D1 into smaller sections has a disadvantage of generating an additional overhead which contributes data to the encoded data D2. Such overhead includes, for example, information indicative of the amount of data bits or data bytes associated with every new section. However, it is always found to be necessary to transmit at least a certain amount of overhead data values, and thus there is only one extra overhead data value when a given data is split into two sections of data.

To achieve an encoded bit stream that can later be decoded, entropy encoding is beneficially implemented after the direct ODelta operator, for example VLC, Arithmetic coding, RLE and similar. It is easier and more computationally efficient to execute optimization computations based on calculated entropy E and minimum bit estimation values in comparison to actual data encoding. Such an order of execution enables a considerable speed optimization, and often achieves an optimal data compression result in the encoded data D2. Alternatively, it is feasible to execute entropy optimization in such a way that original bit, alphabet, number, byte and word data, namely the data D1, is first coded with some other method to generate an entropy-optimized bit stream, and after that, the direct ODelta operator is used to modify the entropy-optimized bit stream to provide corresponding encoded data, namely the data D2. Moreover, this ODelta operated data can still be encoded with other encoding methods from the data D2 to generate the data D3.

The generalized direct ODelta operator employs a parameter that describes a range of values used in the data D1, namely a value or number of bits that are needed to present the values. Moreover, the ODelta operator is employed in a method that enables the use of positive and negative pedestal values. For example, if data D1 is presented with seven bits, namely has values from "0" to "127" supported, but it contains only values in a range of "60" to "115", then, when a pedestal value of −60 is applied to the data D1, there is thereby generated translated data having values in a range of "0" to "55" that can also be represented as values containing only six bits, namely a degree of data compression is thereby feasible to achieve. The generalized direct ODelta operator thus improves results when a full range of data values is present in the data D1, namely represented in seven bits and conventionally represented by 8-bit bytes.

Pursuant to the present invention, direct ODelta values, namely method 1, are susceptible to being computed using a procedure as described by an excerpt of example software code as follows for data that has only positive values:

```
maxValue=power(2, bits)=power(2, 7)=128
predictionValue=maxValue div 2=64
for all pixels
begin
   if(originalValue>=prediction Value) then
      ODeltaValue=original Value−predictionValue
   else
      ODeltaValue=maxValue+originalValue−predictionValue
   predictionValue=original Value
end
```

An example will now be provided to elucidate further the ODelta operator. An original sequence of values is as follows in Equation 11 (eq. 11):

$$65, 80, 126, 1, 62, 45, 89, 54, 66 \qquad \text{Eq. 11}$$

Corresponding Delta coding values are as follows in Equation 12 (Eq. 12):

$$65, 15, 46, -125, 61, -17, 44, -35, 12 \qquad \text{Eq. 12}$$

Corresponding direct ODelta coding values are as follows in Equation 13 (Eq. 13):

$$1, 15, 46, 3, 61, 111, 44, 93, 12 \qquad \text{Eq. 13}$$

wherein wraparound within parameter maxValue is employed.

An inverse ODelta operator, namely method 1, is useable for generating inverse ODelta values, for example as implemented by example software code as follows:
maxValue=power(2, bits)=power(2, 7)=128
predictionValue=maxValue div 2=64
for all pixels
begin
    ODeltaValue=originalValue+predictionValue
    if (ODeltaValue>=maxValue) then
        ODeltaValue=ODeltaValue−maxValue
    predictionValue=ODeltaValue
end When this software code is executed and applied to Equation 13 (Eq. 13), it generates values as provided in Equation 14 (Eq. 14):

$$65, 80, 126, 1, 62, 45, 89, 54, 66 \qquad \text{Eq. 14}$$

This example uses maxValue as a power-of-two value. This is not mandatory and the maxValue can also be any value that is larger than a highest data value, or value larger than the used range, if negative values are also available, or range is modified by pre-pedestal in a given sequence of data. There will be a further example later showing this feature.

To summarize the foregoing with reference to FIG. 1, the present invention is concerned with the encoder 10 and the decoder 20. Optionally, the encoder 10 and the decoder 20 are employed in combination as a codec indicated generally by 30. The encoder 10 is operable to receive original input data D1 which is encoded using a direct ODelta method to generate corresponding encoded data D2 or D3. The encoded data D2 or D3 is optionally communicated via a communication network 40 or stored on data storage media 50, for example a data carrier such as an optical disc read-only-memory (ROM) or similar. The decoder 20 is operable to receive the encoded data D2 or D3, for example streamed via the communication network 40 or provided on the data storage media 50, and to apply an inverse ODelta method to generate corresponding decoded data D5, namely substantially similar to the original data D1. The encoder 10 and the decoder 20 are beneficially implemented using digital hardware, for example computing hardware which is operable to execute one or more software products, for example codes as provided as example embodiments in this description.

The ODelta method as executed in the encoder 10 employs steps as depicted in FIG. 302. In an optional first step 100, the input data D1 is processed to find a range of values of its data elements. In an optional second step 110, from the range of values, an offset, namely a pre-pedestal, is computed for translating the data elements to a positive regime to generate a corresponding set of translated elements. In a third step 120, the elements, optionally translated in the second step 110, are then subject to direct ODelta encoding to generate corresponding ODelta encoded values. In a fourth step 130, the ODelta encoded values and the optional pedestal value are then separately encoded, for example using run-length encoding (RLE) or Huffman coding, to generate the data D3 from data D2. The pedestal value is not always compressible, thus requiring it to be delivered using a suitable amount of bits from the encoder 10 to decoder 20. Moreover, the pedestal value is an optional feature for the direct ODelta operator. Especially, when the direct ODelta operator is implemented for 1-bit data, it does not need a pedestal value at all, and then steps 100 and 110 are always ignored. When a pedestal value is also used in the step 110, the range value presenting the highest value should be updated within it. The number of different values, namely maxValue, should be known also by the decoder 20, or otherwise the encoder 10 should deliver it to the decoder 20 within compressed data. Optionally, at least one of the encoder 10 and the decoder 20 operate in a recursive manner, for example to find an optimal manner in which to subdivide the input data D1 into sections for encoding so as to provide for optimal compression of the data D1 to generate the encoded data D2.

Figure 3:
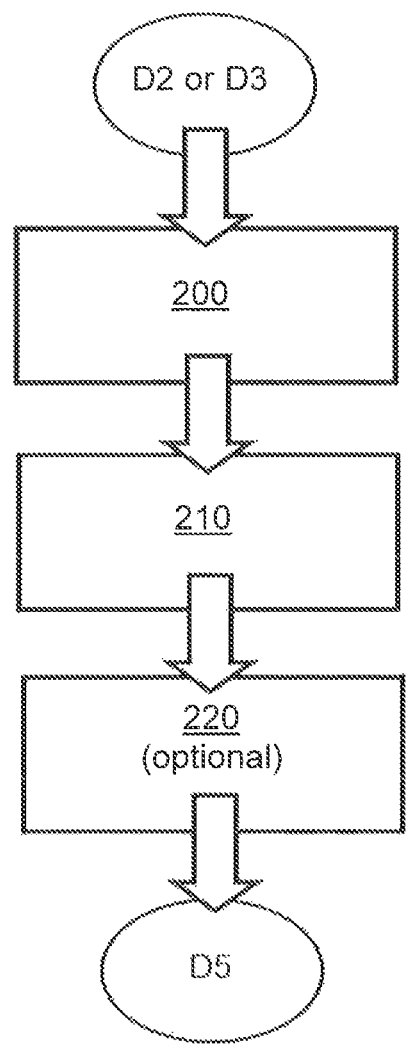
FIG. 3 is an illustration of steps of a method of decoding data as executed in the decoder of FIG. 1.

The inverse ODelta method as executed in the decoder 20 employs steps as depicted in FIG. 3. In a first step 200, the data D2/D3 or D4 is subjected to inverse encoding to that which is employed in the aforesaid step 130 to generate decoded ODelta data, wherein the decoded ODelta data has ODelta-encoded values and optionally have a separate pedestal value. In a second step 210, the ODelta encoded values are decoded to generate a sequence of data elements. In a third step 220, the sequence of data elements are translated using the optional pre-pedestal value to generate the decoded data D5. Again, it is possible to execute the method without needing to employ a pedestal value, for example when performing 1-bit encoding, thereby enabling the step 220 to be ignored. Furthermore, the decoder 20 should also know the maxValue to be able to decode data elements received thereat in a proper manner.

By employing the pedestal to achieve only positive values, more efficient data compression in the data D2 or D3 is capable of being achieved. If all the data values are already positive values, there is no need to add any pedestal value. Of course, negative pedestal values are optionally, employed to reduce the available range, as shown in the next example, but it is not mandatory.

Figure 2:
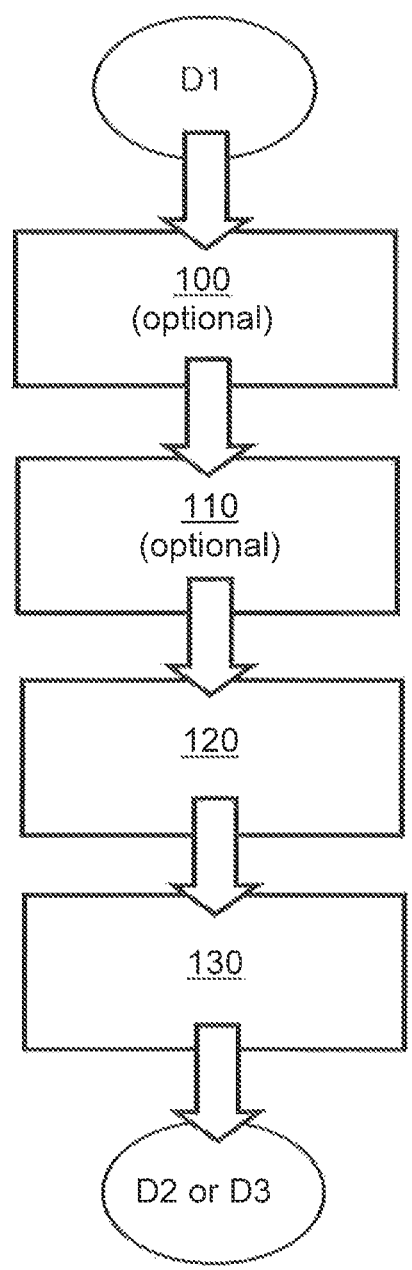
FIG. 2 is an illustration of steps of a method of encoding data as executed in the encoder of FIG. 1.

The methods in FIG. 2 and FIG. 3 can be optionally further optimized by using only the available values subject to ODelta coding. Such optimization requires that used values are known. For example, in an example in the foregoing, only values from 1 to 126 are present in the original data set D1. The pedestal value is then 1. When the pre-pedestal value has been reduced from the original data D1, following values are thereby generated in Equation 15 (Eq. 15):

$$64, 79, 125, 0, 61, 44, 88, 53, 65 \qquad \text{Eq. 15}$$

From Equation 15 (Eq. 15), the maximum value of 125 is determined (=original max−pedestal=126−1), such that the maximum value (=maximum Delta value) can now be 125, or maxValue can be at smallest 126. Now, it is necessary to store and/or deliver these values and then the previous example can be modified by changing process values as follows:
maxValue=126 ("0" to "125"=>126 different values)
predicationValue=maxValue div 2=63

Corresponding direct ODelta operator values are provided in Equation 16 (Eq. 16):

$$1, 15, 46, 1, 61, 109, 44, 91, 12 \qquad \text{Eq. 16}$$

It will be appreciated that all "negative Delta values" are now reduced by a factor of 2 (namely=range change=128−126). Similarly, in the decoder 20, the process values have to be changed as follows:
maxValue=126
predictionValue=maxValue div 2=63

Corresponding inverse ODelta values are as follows in Equation 17 (Eq. 17):

$$64, 79, 125, 0, 61, 44, 88, 53, 65 \qquad \text{Eq. 17}$$

When the pre-pedestal value is added to Equation 17 (Eq. 17), a following result in Equation 18 (Eq. 18) is obtained corresponding to original data in Equation 15 (Eq. 15), namely:

$$65, 80, 126, 1, 62, 45, 89, 54, 66 \qquad \text{Eq. 18}$$

In this example, the range of values is nearly full, so there is a relative modest benefit derived from applying the direct ODelta operator with pedestal and maximum values. However, a reduction in entropy E can still be achieved, namely resulting in less values in a frequency table or in a code table when they are properly delivered. Greatest benefits can be achieved when the range is less used.

An example embodiment of a practical 1-bit direct and inverse ODelta method, namely method 1 or method 3, of encoding and decoding data will now be provided by way of executable computer software code; the method employs the aforesaid direct and inverse ODelta operators, namely method 1 or method 3. The software code is operable, when executed upon computing hardware, to process bits from one byte buffer to another byte buffer. In the software code, GetBit, SetBit and ClearBit functions always update a HeaderBits value. A HeaderIndex value is also updated when a next bit will be in a next byte. Optionally, the software code can be optimized, so that only one set of HeaderIndex and HeaderBits values are used for source and destination, such that values are updated only when a given bit is written to the destination buffer.

```
procedure EncodeODelta1u(APtrSrc : PByte; ASrcDStBitLen : PCardinal; APtrDst : PByte)
var
   iSrcHeaderIndex, iSrcHeaderBits, iIndex,
   iDstHeaderIndex, iDstHeaderBits : Cardinal;
   bBit, bLastBit : Boolean;
begin
   // Resets offsets
   iSrcHeaderIndex := 0;
   iSrcHeaderBits := 0;
   iDstHeaderIndex := 0;
   iDstHeaderBits := 0;
   // Initialise detla value
   bLastBit := False
   // Go through all bits
   for iIndex := 0 to ASrcDstBitLen^-1 do
   begin
      // Read bit
      bBit := GetBit(APtrSrc, @iSrcHeaderIndex, @iSrcHeaderBits);
      // Set destination bit if current source bit is different than previous source bit
      if (bBit < > bLastBit) then
      begin
         SetBit(APtrDst, @iDstHeaderIndex, @iDstHeaderBits);
         bLastBit := bBit;
      end;
      else ClearBit(APtrDst, @iDstHeaderIndex, @iDstheaderBits);
   end;
end;
function DecodeODelta1u(APtrSrc : PByte; ASrcDstBitLen : PCardinal; APtrDst : PByte) :
Boolean:
var
   iSrcHeaderIndex, iSrcHeaderBits, iIndex,
   iDstHeaderIndex, iDstHeaderBits : Cardinal;
   bBit, bLastBit : Boolean;
begin
   // Reset offsets
   iSrcHeaderIndex := 0;
   iSrcHeaderBits := 0;
   iDstHeaderIndex := 0;
   iDstHeaderBits := 0;
   // Initialise delta value
   bLastBit := False;
   // Go through all bits
   for iIndex := 0 to ASrcDstBitLen^-1 do
   begin
      // Read bit
      bBit := GetBit(APtrSrc, @iSrcHeaderIndex, @iSrcHeaderBits);
      // Change bit value if source bit is true
      if (bBit = True) then
      begin
         if (bLastBit = True) then
            bLastBit := False
         else bLastBit := True:
      end;
```

-continued

```
// Set destination bit based on bit value (True or False)
if (bLastBit) then
    SetBit(APtrDst, @iDstHeaderIndex, @iDstHeaderBits)
    else ClearBit(APtrDst, @iDstHeaderIndex, @iDstHeaderBits);
  end;
end;
```

The aforementioned direct and inverse ODelta operators, namely method 1 or method 3, are beneficially employed to compress any type of data that is in a digital format, for example video data, image data, audio data, graphics data, seismological data, medical data, measurement values, reference numerals and masks. Moreover, analog data is also compressible using the direct ODelta operator when firstly converted to corresponding digital data, for example by use of ADC's before the compression. When inverse ODelta operator is used then DAC's can be used after the operation, if it is desired that the data be converted back to analog data. However, it will be appreciated that the direct ODelta operator by itself is not usually effective at compressing data, but is capable of providing effective data compression when employed in combination with other encoding methods, for example variable-length coding (VLC), arithmetic coding, range coding, run-length encoding, SRLE, Entropy Modifier and so forth. These encoding methods are used for data D2 after the direct ODelta operator is employed in the encoder 10. The encoded data D2 has to be correspondingly decoded back before the resulting data is delivered to the inverse ODelta operator implemented in the decoder 20. The ODelta operator can also be employed with other types of entropy modifiers. In certain situations, the direct ODelta operator can result in an increase in entropy E, and data compression algorithms are beneficially operable to employ the direct ODelta operator selectively for use in encoding data only when it provides a beneficial data compression performance, for example it is employed selectively based upon a nature of data to be compressed, for example applied selectively to selected portions of the input data D1 as aforementioned.

The direct ODelta operator has been devised, for example, to be employed in combination with a block encoder as described in a U.S. patent application Ser. No. 13/584,005, which is hereby incorporated by reference, and the inverse ODelta operator has been devised to be employed in combination with a block decoder as described in a U.S. patent application Ser. No. 13/584,047 which is hereby incorporated by reference. Optionally, the direct ODelta operator and inverse ODelta operator are beneficially employed in combination with a multilevel coding method as described in U.S. patent application Ser. No. 13/657,382, which is hereby incorporated by reference. Beneficially, all types of 1-bit data, for example the data D1, that include binary states are subject to the 1-bit version of the direct ODelta operator to generate corresponding transformed data, which is then thereafter subjected to actual entropy encoding to generate the encoded data D2 or D3. Optionally, as aforementioned, the direct ODelta operator is employed selectively depending upon a nature of the original data D1.

Optionally, it is feasible to employ other methods of modifying entropy of data before or after the direct ODelta operator. For example, the direct ODelta operator can also be used directly for multi-bit data within a generalized version of the direct ODelta operator. Moreover, the aforesaid 1-bit version of the direct ODelta operator is beneficially employed for multi-bit data, after all used bits are first put into a serial sequence of bits.

When multiple methods are employed for data compression in conjunction with the direct ODelta operator in the encoder 10, corresponding inverse operations are performed in reverse order in the decoder 20, for example:

The following sequence of methods are employed in the encoder 10:

[data D1]=>direct ODelta (method 2)

=>VLC-

=>EM

=>Arithmetic coding

=>[data D3]                                                                 Eq. 19

The following inverse sequence of methods are employed in the decoder 20:

[data D3]=>inverse Arithmetic coding

=>inverse EM

=>inverse VLC

=>inverse ODelta (method 2)

=>[data D5]                                                                   Eq 20 wherein "VLC" denotes variable-length coding, and "EM" denotes entropy modifying.

The ODelta operator as described in the foregoing is reversible and lossless. Moreover, the ODelta operator is optionally susceptible to being implemented specifically for 1-bit data streams, but also for other data. Beneficially, all types of data are susceptible to being processed using a generalized version of the direct ODelta operator. Beneficially, the direct ODelta operator is employed when data is to be compressed, and a corresponding inverse ODelta operator is employed when compressed data is to be decompressed. Optionally, when the ODelta operator is employed, the direct ODelta operator and its corresponding inverse operation are employed in a reverse order; in other words, the inverse ODelta operator is performed temporally first on an original bit stream, thereafter followed by the direct ODelta operator, for regenerating the original bit stream. One ODelta operator increases entropy and the other ODelta operator decreases entropy. It is a very rare case that the direct ODelta operator should not modify entropy at all, and then neither inverse ODelta operator modifies entropy. It is to be noted that the when the direct and inverse ODelta operators are used, for example for method 1, then the inverse order of these operations are similar to the normal order of method 4. Similar change of order is possible also with method 2 and method 3.

In the 1-bit version, the direct ODelta operator starts without prediction, namely it assumes by default a prediction of an initial "0" value. In a generalized version, the ODelta operator starts with a prediction that represents half of a usable data range; for example, if 5-bits are used for input data values in the data D1, namely thirty two different values in a range from "0" to "31", the prediction value is 32/2=16. Beneficially, the ODelta operator needs to be provided with information regarding a useable data range for data elements to be processed using the operator.

Embodiments of the invention described in the foregoing make it possible to reduce the entropy E that is presented in the data D1 as bits or any digital values. The direct ODelta operator nearly always provides improved entropy reduction as compared to Delta coding. Only the case where Delta coding is used together with byte wraparound, and the difference ODelta operation with original prediction (method 1) uses the values maxValue=256, lowValue=MIN=0, and highValue=MAX=255, produces the identical output result within it. If another direct ODelta method is used, or if the entire data range is not available in the input data, then the ODelta operator produces better results by sending the selected method or lowValue and/or highValue, namely that modifies also maxValue automatically. Smaller entropy enables data to be compressed with higher data compression ratios. Higher data compression ratios enable smaller capacity data storage to be employed, and also enable slower data bandwidths to be employed when communicating compressed data, with corresponding reduction in energy consumption.

In the foregoing, it will be appreciated that a form of difference and sum computation is executed in the encoder 10, and a corresponding inverse computation is performed in the decoder 20. It is also possible to use another prediction method used in the encoder 10, and a corresponding inverse prediction is then performed in the decoder 20. This means that there are actually at least four different direct ODelta methods as well as at least four corresponding inverse ODelta methods. A detailed and exact description of these methods follows. Optionally, the computations are performed in a recursive manner to obtain a higher degree of data compression in the encoded data D2 (or D3). When executing such recursive computations, a changing number range is employed as a function of how many recursive computations have been employed. For example, in the encoder 10, a following sequence of computations is performed on the data D1 to generated the encoded data D2 (or D3):

[Data D1] edirect ODelta (method 3)=> edirect ODelta (method 3)=> eEM=> edirect ODelta (method 1)=> eVLC [Data D3]                              Eq. 21 and corresponding inverse operations are performed in the decoder 20:

[Data D3] dVLC=> dinverse ODelta (method 1)=> dEM=> dinverse ODelta (method 3)=> dinverse ODelta (method 3) [Data D5]        Eq. 22

Each time data is operated upon in these four methods, as denoted by Equations 21 (Eq. 21 corresponding to method 1), Equation 22 (Eq. 22 corresponding to method 2), Equation 23 (Eq. 23 corresponding to method 3), and Equation 24 (Eq. 24 corresponding to method 4), it is optionally possible to try to use all methods, because one of these methods might decrease entropy of data being processed more than the other methods. Upon optimizing the use of methods within the encoder 10 and/or the decoder 20, it is advantageous to use the same or different methods as many times and as long as the selected method, or methods, decrease entropy, as compared to the amount of information in the data required.

The difference operation represents a remainder of consecutive number values; correspondingly, the sum operation represents a sum of consecutive number values. These operations as executed in the encoder 10 have their own corresponding inverse operations in the decoder 20. The difference or sum can be computed based on the current input value and the previous input or result value that is used as a prediction value. Other prediction values could also be used and they might e.g. use earlier input and output values in the encoder to create the prediction as long as it is reversible to do so also in the decoder.

None of such methods compress data significantly within the encoder 10 and decoder 20, but all methods are beneficially employed to reduce entropy, so that some other compression method can then compress the entropy-reduced data more efficiently. Such other compression method is optionally at least one of: Huffman coding, arithmetic coding, range coding, RLE coding, SRLE coding, entropy modifier coding. However, for all methods, it is necessary to communicate a few number values with which the operation and its inverse operation can always be executed exactly, for example if lossless compression and subsequent lossless decompression of data is to be achieved. Of course, the encoder 10 and the decoder 20 have information regarding which sort of number values are contained in the input data D1. Beneficially, it is assumed that the number range, namely defined by MIN and MAX, is known. In principle, the methods can always function directly on the basis of an existing data range. The number values that the operations need are the lowest occurring number value (lowValue) and the highest occurring number value (highValue); lowValue is greater than or equal to MIN, and highValue is less than or equal to MAX.

On a basis of these values, other necessary number values can be derived. Beneficially, these values are communicated in various forms, wherein missing values are beneficially computed. For example, if two values from a set ["lowValue", "highValue", "number"] are known, the "number" is [highValue−lowValue], then a third value can be computed therefrom. Omitting certain values in the data D2, and then deriving them in the decoder 20 is capable of providing greater data compression in the data D2.

In addition to these values, a number P is required which can be used as a previous value in computation of the first value, namely "prediction". A value between "0" and a "number" value can always be chosen for the number P, namely "prediction". Moreover, the aforesaid operations need to be provided with the value "maxValue", in order to function recoverably when decoding the data D2/D3 or D4 in the decoder 20, namely to shrink a value range that the operations generate to be as small as possible. However, this "maxValue" has to be larger than the "number", and beneficially it will have a value "number"+1. Optionally, depending a nature of the data D1, the first "prediction" value can be chosen to be "0" as aforementioned, for example if the data D1 is assumed to contain more small values than larger ones; alternatively, the first "prediction" value can be chosen to be equal to the "number", if the data D1 is assumed to contain more larger values than smaller ones. In an event that an assumption is not made for the magnitude of values, then it is desirable to use a value "maxValue div 2" for the "prediction" value.

Examples of operations performed in computing hardware when implementing embodiments of the present invention will now be described.

In the encoder 10, the first direct difference operation, namely method 1, is beneficially implemented as follows; for all data values, an output value, namely "result", that corresponds to the input value, namely "original" value, is computed in a software loop:

result=original−prediction
if result<lowValue then result=result+maxValue

Finally, the prediction value for the next input is set to be equal to the current input, namely:

prediction=original

In the decoder 20, the first inverse difference operation, namely method 1, is beneficially implemented as follows: for all data values, an output value, namely "result", that corresponds to the input value, namely "original" value, is computed in a software loop:

result=original+prediction
if result>highValue then result=result−maxValue

Finally, the prediction value for the next input is set to be equal to the current result, namely:

prediction=result

In the encoder 10, the second direct difference operation, namely method 2, is beneficially implemented as follows; for all data values, an output value, namely "result", that corresponds to the input value, namely "original" value, is computed in a software loop:

result=original−prediction
if result<lowValue then result=result+maxValue

Finally, the prediction value for the next input is set to be equal to the current result, namely:

prediction=result

In the decoder 20, the second inverse difference operation, namely method 2, is beneficially implemented as follows: for all data values, an output value, namely "result", that corresponds to the input value, namely "original" value, is computed in a software loop:

result=original+prediction
if result>highValue then result=result−maxValue

Finally, the prediction value for the next input is set to be equal to the current input, namely:

prediction=original

In the encoder 10, the first direct sum operation, namely method 3, is beneficially implemented as follows: for all data values, an input value, namely "result", that corresponds to the input value, namely "original", is computed in a software loop as follows:

result=original+prediction
if result>highValue then result=result−maxValue

Finally, the prediction value for the next input is set to be equal to the current input as follows:

prediction=original

In the decoder 20, the first inverse sum operation, namely method 3, is beneficially implemented as follows: for all data values, an input value, namely "result", that corresponds to the input value, namely "original", is computed in a software loop as follows:

result=original−prediction
if result<lowValue then result=result+maxValue

Finally, the prediction value for the next input is set to be equal to current result, namely:

prediction=result

In the encoder 10, the second direct sum operation, namely method 4, is beneficially implemented as follows: for all data values, an input value, namely "result", that corresponds to the input value, namely "original", is computed in a software loop as follows:

result=original+prediction
if result>highValue then result=result−maxValue

Finally, the prediction value for the next input is set to be equal to the current result as follows:

prediction=result

In the decoder 20, the second inverse sum operation, namely method 4, is beneficially implemented as follows: for all data values, an input value, namely "result", that corresponds to the input value, namely "original", is computed in a software loop as follows:

result=original−prediction
if result<lowValue then result=result+maxValue

Finally, the prediction value for the next input is set to be equal to current input namely:

prediction=original

Such sum and difference operations, all four methods, are also applicable to 1-bit data, namely when implementing ODelta versions of the encoder 10 and decoder 20. In a situation of 1-bit data, the next values are already known by both the encoder 10 and the decoder 20, namely MIN=0, MAX=1. Moreover, it is beneficially assumed that lowValue=MIN=0, and highValue=MAX=1. Furthermore, in such case, the "number" is therefore [highValue−lowValue=1−0=1], and maxValue is beneficially chosen to be "number"+1=1+1=2. Beneficially, the prediction value is chosen to be a value "0", because there is only 1-bit data being considered that can only have positive values starting from lowValue=MIN=0. For 1-bit data, method 1 and method 3 yield mutually similar coding results. Similarly, method 2 and method 4 yield mutually similar coding results. Having such knowledge beneficially simplifies the information which needs to be sent in the data D2, as various defaults can be assumed, namely it is only necessary to send information about the number of execution times of the difference operations, either method 1 or method 2, and the selected prediction (input value (method 1) or result value (method 2)), so that the decoder 20 can execute the correct inverse difference operation a requisite number of times when decoding the data D2/D3 or D4 to generate the decoded data D5.

The first example that was created by using method 1 or method 3 that creates similar output, can also be processed by using either method 2 or method 4, which also create similar output. The result shown below can be achieved by those methods when applied to the data Eq 1:

0110010001110011111111111110101010101

This time, the processed data has twenty four "1"'s and thirteen "0"'s, namely the entropy would be the same as in the first example, but the counts of "1" and "0" would change places. This does not always occur, instead often the entropy changes as well between these different methods. For example, after the four first elements of data, method 1 and/or method 3 would produce three "1"'s and one "0", whereas in the original data and the data that has been processed with method 2 and/or method 4 would have two "1"'s and two "0"'s. Therefore, method 1 and/or method 3 would produce smaller entropy than method 2 and/or method 4, and also smaller entropy than originally.

In a multi-bit implementation, if the data D1 includes values in a range from −64 to +63, then MIN=−64 and MAX=63. By assuming lowValue=MIN and highValue=MAX, the "number"=127 and maxValue is beneficially chosen to be 128. However, when the data D1 varies at random, the "prediction" value is beneficially set to a value [maxValue div 2=64]. It is to be noted that when the "prediction" value is out of the range (from −64 to 63), it has to be converted so that it fits inside the range, and so the "prediction" value actually is 64−128=−64 that is inside the range. It is also possible to select so that the prediction value is, for example, the calculated "prediction"+lowValue=64+−64=0, because then it better represents the mid-range value.

It is to be noted that, if the first value is for example −1, the first coded value with the direct ODelta method 1, and/or method 2, would be −1−0=−1, and correspondingly, with the direct ODelta method 3, and/or method 4, −1+0=−1. The next values would then change according to how the data progresses, for example if the second value would be 5, then the direct ODelta method 1 would produce 5−−1=6, direct ODelta method 2 would produce 5−−1=6, direct ODelta method 3 would produce 5+−1=4, and direct ODelta method 4 would produce 5+−1=4. The decoder 20 would in this case be able to produce as the first value when using the inverse ODelta method 1, and/or method 2, −1+0=−1 and with the inverse ODelta method 3, and/or method 4, −1−0=−1. Correspondingly, the second value with the inverse ODelta method 1 would be 6+−1=5, with the inverse ODelta method 2 it would be 6+−1=5, with the inverse ODelta method 3 it would be 4−−1=5 and with the inverse ODelta it would be 4−−1=5.

This solution can then be optimized if the number range actually only contains values between −20 and +27. In this example case, it is feasible to transmit, for example, lowValue=−20 and highValue=27. If both are transmitted, it is feasible to calculate that number=47 and maxValue is then chosen to be beneficially 48. Now, it is feasible to calculate the value 24 or actually 24+−20=4 for prediction. Then, the previous example would yield for example for the value −1 when the ODelta method 1, or method 2, is used: −1−4=−5 and with the ODelta method 3, or method 4, −1+4=3. Similarly, the second value would be for ODelta methods as (5−−1)=6, (5−−5)=10, (5+−1)=4, and (5+3)=8. The decoding 20 functions correctly again and yields the first value for method 1, and/or method 2, as −5+4=−1 and for method 3, and/or method 4, as 3−4=−1. Correspondingly, the second values for different methods would be decoded as (6+−1)=5, (10+−5)=5, (4−−1)=5, and (8−3)=5.

It is to be noted that all the values in these examples above are inside the range, namely from −64 to +63 or from −20 to +27, and so it is not necessary to perform the correction term within these example values, but if any negative or positive change is big enough, then the correction to the data values have to be made by the given Equations 21 to 24 (Eq. 21 to Eq. 24) to keep the result values within the range.

When lowValue is known, coded values are beneficially arranged to start with 0 and to end with a value "number", for simplifying a coding table which must be sent from the encoder 10 to the decoder 20 with the entropy encoded data D3. This operation is called post-pedestal, and this post-pedestal value has to be deleted from the coded data values after the entropy decoding and before the inverse ODelta operation to data D4.

As mentioned earlier, it is also possible to implement the pedestal with the pre-pedestal functionality, where the original input data (D1) is transformed into positive elements which can contain values from zero to "number" already before the actual execution of the ODelta method. Also in this situation, the information transmission that this operation requires is beneficial to perform in such a way that the "pre-pedestal" and Odelta method do not repeatedly transmit the same information, or ignore what is already known thanks to some other method. This pre-pedestal effect should be deleted from the decoded data after the inverse ODelta operation to create proper D5 output data.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. An encoder (10) for encoding input data (D1) to generate corresponding encoded output data (D2 or D3), wherein the encoder (10) includes a data processing arrangement for analyzing values present in the input data (D1), and for translating the input data (D1) using results of the analysis to generate translated data, and then to apply a form of ODelta coding to the translated data to generate processed data, and to combine the processed data with the results of the analysis for generating the encoded output data (D2 or D3).

2. The encoder (10) as claimed in claim 1, wherein the data processing arrangement is operable to analyze a range of values in the input data (D1) and to generate at least one pre- and/or post-pedestal value for use in generating the translated data, and is operable to combine the processed data and the at least one pedestal value for generating the encoded output data (D2 or D3).

3. The encoder (10) as claimed in claim 1, wherein the encoder (10) is operable to subdivide the input data (D1) into a plurality of sections of data which are separately encoded.

4. The encoder (10) as claimed in claim 3, wherein the encoder (10) is operable to apply the form of ODelta coding selectively to the sections of data only when data compression is thereby achievable in the encoded output data (D2 or D3).

5. The encoder (10) as claimed in claim 3, wherein the encoder (10) is operable to subdivide the input data (D1) into a plurality of sections depending upon run-lengths of mutually similar bits in the processed data which are efficient for encoding using run-length encoding (RLE), Huffman coding, variable-length encoding (VLE), range coding and/or arithmetic encoding.

6. The encoder (10) as claimed in claim 1, wherein the encoder (10) is operable to apply a form of 1-bit ODelta coding to the translated data.

7. The encoder (10) as claimed in claim 6, wherein the encoder (10) is operable to employ a default first value for a series of encoded values present in the output encoded data (D2 or D3).

8. The encoder (10) as claimed in claim 7, wherein the default first value is "0".

9. The encoder (10) as claimed in claim 1, wherein the encoder (10) is operable to apply additional encoding to the processed data to generate the encoded output data (D2), wherein the additional encoding includes at least one of: run-length encoding (RLE), variable length coding (VLC), Huffman coding, arithmetic coding, range coding.

10. The encoder (10) as claimed in claim 1, wherein the form of ODelta coding employs wraparound within a defined parameter value.

11. The encoder (10) as claimed in claim 1, wherein the processing arrangement is implementing using computing hardware operable to execute one or more software products recorded on machine-readable data-storage media.

12. A codec (30) including at least one encoder (10) as claimed in claim 1 for encoding input data (D1) to generate corresponding encoded data (D2), and at least one decoder (20) for decoding the encoded data (D2 or D3) to generate corresponding decoded data (D5), the at least one decoder (20) comprising a data processing arrangement for processing the encoded data (D2 or D3) to extract therefrom at least one pre- and/or post-pedestal value, for applying a form of ODelta decoding to one or more portions of the encoded data (D2 or D3) to generate corresponding processed data, and to translate the one or more portions using the at least one pre- and/or post-pedestal value to generate the decoded output data (D5).

13. A method of using an encoder (10) for encoding input data (D1) to generate corresponding encoded output data (D2), wherein the method includes:
  (a) using a data processing arrangement for analyzing values present in the input data (D1);
  (b) using the data processing arrangement to translate the input data (D1) based upon results of the analysis to generate translated data;
  (c) using the data processing arrangement to apply a form of ODelta coding to the translated data to generate processed data; and
  (d) using the data processing arrangement to combine the processed data and results of the analysis for generating the encoded output data (D2 or D3).

14. The method as claimed in claim 13, wherein the method includes using the data processing arrangement to analyze a range of values in the input data (D1) and to generate at least one pre- and/or post-pedestal value for use in generating the translated data, and to combine the processed data and the at least one pedestal value for generating the encoded output data (D2 or D3).

15. The method as claimed in claim 13, wherein the method includes using the data processing arrangement to subdivide the input data (D1) into a plurality of sections of data which are then separately encoded.

16. The method as claimed in claim 15, wherein the method includes applying the form of ODelta coding selectively to the sections of data only when data compression is thereby achievable in the encoded output data (D2 or D3).

17. The method as claimed in claim 15, wherein the method includes applying a form of 1-bit ODelta coding (ODelta) to the translated data.

18. The method as claimed in claim 17, wherein the method includes employing a default first value for a series of encoded values present in the output encoded data (D2 or D3).

19. The method as claimed in claim 18, wherein the method includes employing a value "0" for the default first value.

20. The method as claimed in claim 13, wherein the method includes applying additional encoding to the processed data to generate the encoded output data (D2 or D3), wherein the additional encoding includes at least one of: run-length encoding (RLE), variable length coding (VLC), Huffman coding, arithmetic coding, range coding.

21. The method as claimed in claim 13, wherein the form of ODelta coding employs wraparound within a defined parameter value.

22. The method as claimed in claim 13, wherein the method includes implementing the processing arrangement using computing hardware operable to execute one or more software products recorded on machine-readable data-storage media.

23. A computer program product comprising a non-transitory computer readable storage medium having computer readable instructions stored thereon, the computer readable instructions being executable by a computerized device comprising a processor to execute a method of encoding data as claimed in claim 13.

24. A decoder (20) for decoding encoded data (D2 or D3) to generate corresponding decoded output data (D5), wherein the decoder (20) includes a data processing arrangement for processing the encoded data (D2 or D3) to extract therefrom at least one pre- and/or post-pedestal value, for applying a form of ODelta decoding to one or more portions of the encoded data (D2 or D3) to generate corresponding processed data, and to translate the one or more portions using the at least one pre- and/or post-pedestal value to generate the decoded output data (D5).

25. The decoder (20) as claimed in claim 24, wherein the data processing arrangement is operable to apply to data being processed therethrough an inverse of at least one of: run-length encoding (RLE), variable-length coding (VLC), Huffman coding, arithmetic coding, range coding.

26. The decoder (20) as claimed in claim 24, wherein the data processing arrangement is operable to employ wraparound in a digital parameter when implemented the form of ODelta decoding.

27. The decoder (20) as claimed in claim 24, wherein the data processing arrangement is operable to assume a default value of first value in a series of data being decoded therethrough.

28. The decoder (20) as claimed in claim 27, wherein the default value has a value "0".

29. The decoder (20) as claimed in claim 24, wherein the processing arrangement is implementing using computing hardware operable to execute one or more software products recorded on machine-readable data-storage media.

30. A method of using a decoder (20) for decoding encoded data (D2 or D3) to generate corresponding decoded output data (D5), wherein the method includes:
  (a) using a data processing arrangement to process the encoded data (D2 or D3) to extract therefrom at least one pre- and/or post-pedestal value;
  (b) using the data processing arrangement to apply a form of ODelta decoding to one or more portions of the encoded data (D2 or D3) to generate corresponding processed data; and
  (c) using the data processing arrangement to translate the one or more portions using the at least one pre- and/or post-pedestal value to generate the decoded output data (D5).

31. The method as claimed in claim 30, wherein the method includes using the data processing arrangement to apply to data being processed therethrough an inverse of at least one of: run-length encoding (RLE), variable-length coding (VLC), Huffman coding, arithmetic coding, range coding.

32. The method as claimed in claim 30, wherein the method includes using the data processing arrangement to employ wraparound in a digital parameter when implemented the form of ODelta decoding.

33. The method as claimed in claim 30, wherein the method including using the data processing arrangement to assume a default value of first value in a series of data being decoded therethrough.

34. The method as claimed in claim 33, wherein the default value has a value "0".

35. The method as claimed in claim 30, wherein the method includes implementing the processing arrangement using computing hardware operable to execute one or more software products recorded on machine-readable data-storage media.

36. A computer program product comprising a non-transitory computer readable storage medium having computer readable instructions stored thereon, the computer readable instructions being executable by a computerized device comprising a processor to execute a method of decoding data as claimed in claim 30.

* * * * *